(12) United States Patent
Kawachi et al.

(10) Patent No.: US 9,667,221 B2
(45) Date of Patent: May 30, 2017

(54) ACOUSTIC WAVE DEVICE

(71) Applicant: TAIYO YUDEN CO., LTD., Tokyo (JP)

(72) Inventors: Osamu Kawachi, Tokyo (JP); Kensei Uehara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 169 days.

(21) Appl. No.: 14/463,441

(22) Filed: Aug. 19, 2014

(65) Prior Publication Data

US 2014/0354374 A1    Dec. 4, 2014

Related U.S. Application Data

(63) Continuation of application No. PCT/JP2012/054750, filed on Feb. 27, 2012.

(51) Int. Cl.
*H03H 9/10* (2006.01)
*H03H 9/70* (2006.01)
(Continued)

(52) U.S. Cl.
CPC ...... *H03H 9/0538* (2013.01); *H03H 9/02535* (2013.01); *H03H 9/0542* (2013.01); *H03H 9/0547* (2013.01); *H03H 9/0561* (2013.01); *H03H 9/0566* (2013.01); *H03H 9/0571* (2013.01); *H03H 9/0576* (2013.01); *H03H 9/1071* (2013.01); *H03H 9/1085* (2013.01); *H03H 9/725* (2013.01);
(Continued)

(58) Field of Classification Search
CPC ....... H03H 2009/0019; H03H 9/02535; H03H 9/0538; H03H 9/0542; H03H 9/0547; H03H 9/0552; H03H 9/0557; H03H 9/0561; H03H 9/0566; H03H 9/0571; H03H 9/0576; H03H 9/64; H03H 9/706; H03H 9/725; H03H 9/74; H03H 9/76
USPC ............. 333/133, 193, 195, 189; 310/313 R, 310/313 B, 313 D
See application file for complete search history.

(56) References Cited

U.S. PATENT DOCUMENTS 5,789,845 A * 8/1998 Wadaka ................. H03B 5/326
310/311
6,060,960 A * 5/2000 Tanaka .................... H01P 1/15
333/104

(Continued)

FOREIGN PATENT DOCUMENTS

DE    10 2005 026 243 A1    12/2006
EP          1 469 512 A1    10/2004
(Continued)

OTHER PUBLICATIONS

English language machine translation of JP 06-006170 A, published on Jan. 14, 1994, 7 pages.*
(Continued)

*Primary Examiner* — Barbara Summons
(74) *Attorney, Agent, or Firm* — Chen Yoshimura LLP

(57) ABSTRACT

An acoustic wave device includes: a first chip that includes a first substrate, and a first filter formed on a first surface of the first substrate; and a second chip that includes a second substrate, and a second filter formed on a second surface of the second substrate, the second surface being located in a plane different from the first surface.

10 Claims, 8 Drawing Sheets

(51) Int. Cl.
  *H03H 9/72* (2006.01)
  *H03H 9/05* (2006.01)
  *H03H 9/02* (2006.01)
  *H03H 9/00* (2006.01)

(52) U.S. Cl.
  CPC ............ *H01L 2224/16225* (2013.01); *H01L 2924/181* (2013.01); *H03H 9/059* (2013.01); *H03H 2009/0019* (2013.01)

(56) References Cited

U.S. PATENT DOCUMENTS

| | | | |
|---|---|---|---|
| 6,445,262 B1 * | 9/2002 | Tanaka | H03H 7/463 333/101 |
| 6,974,724 B2 * | 12/2005 | Hyvonen | H01L 23/5389 257/659 |
| 7,271,684 B2 * | 9/2007 | Nishihara | H03H 9/0095 333/133 |
| 7,289,008 B2 * | 10/2007 | Kuroki | H04B 1/0057 333/133 |
| 2002/0135267 A1 | 9/2002 | Takamine | |
| 2004/0238954 A1 | 12/2004 | Miyaji et al. | |
| 2007/0108634 A1 | 5/2007 | Higashi et al. | |
| 2007/0115079 A1 | 5/2007 | Kubo et al. | |
| 2009/0224851 A1 | 9/2009 | Feiertag et al. | |
| 2009/0309673 A1 * | 12/2009 | Iwamoto | H03H 3/08 333/133 |
| 2011/0146041 A1 | 6/2011 | Miyake et al. | |
| 2012/0223789 A1 * | 9/2012 | Inoue | H01L 41/053 333/193 |

FOREIGN PATENT DOCUMENTS

| | | | |
|---|---|---|---|
| JP | 06-006170 A | * | 1/1994 |
| JP | 2000-040939 A | | 2/2000 |
| JP | 2000-049564 A | | 2/2000 |
| JP | 2001-257236 A | * | 9/2001 |
| JP | 2002-043890 A | | 2/2002 |
| JP | 2002-208832 A | | 7/2002 |
| JP | 2003-218150 A | | 7/2003 |
| JP | 2003-283139 A | | 10/2003 |
| JP | 2005-183571 A | | 7/2005 |
| JP | 2006-203542 A | | 8/2006 |
| JP | 2006-311183 A | | 11/2006 |
| WO | 2006/008940 A1 | | 1/2006 |

OTHER PUBLICATIONS

English language machine translation of JP 2001-257236 A, published on Sep. 21, 2001, 6 pages.*
International Search Report (ISR) issued in PCT/JP2012/054750 mailed in Mar. 2012.
Written Opinion (PCT/ISA/237) issued in PCT/JP2012/054750 mailed in Mar. 2012.
German Office Action dated Feb. 19, 2016, in a counterpart German patent application No. 11 2012 005 948.4.
English translation of Written Opinion (PCT/ISA/237) issued in PCT/JP2012/054750 mailed in Mar. 2012.
Japanese Office Action dated Feb. 2, 2016 in a counterpart Japanese patent application No. 2014-501849.

* cited by examiner

ACOUSTIC WAVE DEVICE

CROSS-REFERENCE TO RELATED APPLICATION

This application is a continuation application of PCT/JP2012/054750 filed Feb. 27, 2012, the contents of which are herein wholly incorporated by reference.

FIELD

The present invention relates to an acoustic wave device.

BACKGROUND

An acoustic wave resonator, such as a surface acoustic wave (SAW) resonator and a piezoelectric thin film resonator, is used as a filter excellent in a high frequency characteristic. With the spread of mobile communication terminals in recent years, a device which includes a plurality of filters, such as a demultiplexer and a dual filter, is used. In order to downsize the device, it is demanded that the plurality of filters are arranged close to each other. A substrate into which a plurality of SAW filters are embedded is described in Japanese Laid-open Patent Publication No. 2003-283139.

However, with the conventional technology, isolation between the filters might not fully be secured.

SUMMARY OF THE INVENTION

According to an aspect of the present invention, there is provided an acoustic wave device by including: a first chip that includes a first substrate, and a first filter formed on a first surface of the first substrate; and a second chip that includes a second substrate, and a second filter formed on a second surface of the second substrate, the second surface being located in a plane different from the first surface.

DETAILED DESCRIPTION

Figure 1A:
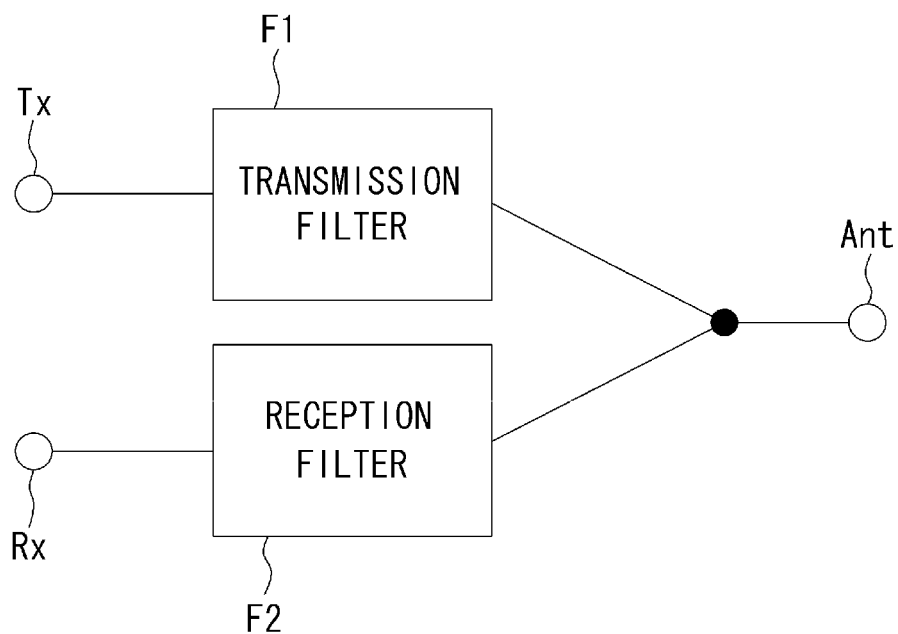
FIG. 1A is a block diagram illustrating a demultiplexer.

First, a description will be given of a device which uses a plurality of filters. FIG. 1A is a block diagram illustrating a demultiplexer.

As illustrated in FIG. 1A, a transmission filter F1 is electrically connected between an antenna terminal Ant (common terminal) and a transmission terminal Tx, and a reception filter F2 is electrically connected between the antenna terminal Ant and a reception terminal Rx. A pass band of the transmission filter F1 differs from a pass band of the reception filter F2, for example. The transmission filter F1 allows a signal whose frequency is in the pass band of the transmission filter F1, among transmission signals inputted from the transmission terminal Tx, to pass, and suppresses a signal whose frequency is outside the pass band. The transmission signal filtered by the transmission filter F1 is transmitted from an antenna (not shown) connected to the antenna terminal Ant to the outside. The reception filter F2 allows a signal whose frequency is in the pass band, among reception signals received by the antenna, to pass, and suppresses a signal whose frequency is outside the pass band. The reception signal filtered by the reception filter F2 is inputted to an electronic component, such as an IC (Integrated Circuit), through the reception terminal Rx. The transmission signal and the reception signal are high frequency signals in which each frequency is located in a GHz band, for example.

Figure 1B:
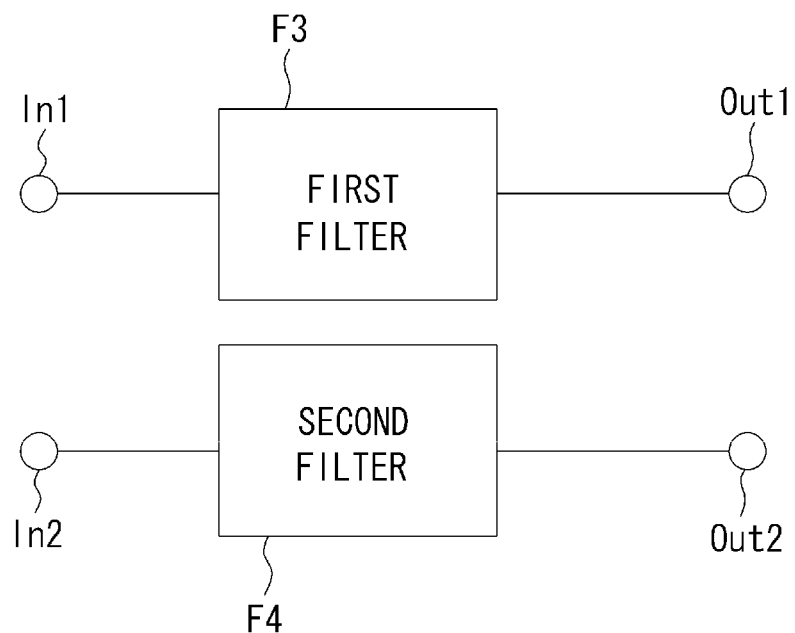
FIG. 1B is a block diagram illustrating a dual filter.

FIG. 1B is a block diagram illustrating a dual filter. A filter F3 is electrically connected between an input terminal In1 and an output terminal Out1. A filter F4 is electrically connected between an input terminal In2 and an output terminal Out2, and is not electrically connected to the filter F3. A pass band of the filter F3 does not overlap with a pass band of the filter F4. Therefore, a signal outputted from the output terminal F3 and a signal outputted from the output terminal F2 have different frequencies, respectively. By setting the filters F3 and F4 to the transmission filters, for example, the dual filter can transmit two transmission signals corresponding to different communication methods. Moreover, by setting the filters F3 and F4 to the reception filters, the dual filter can transmit two reception signals corresponding to different communication methods.

Figure 2:
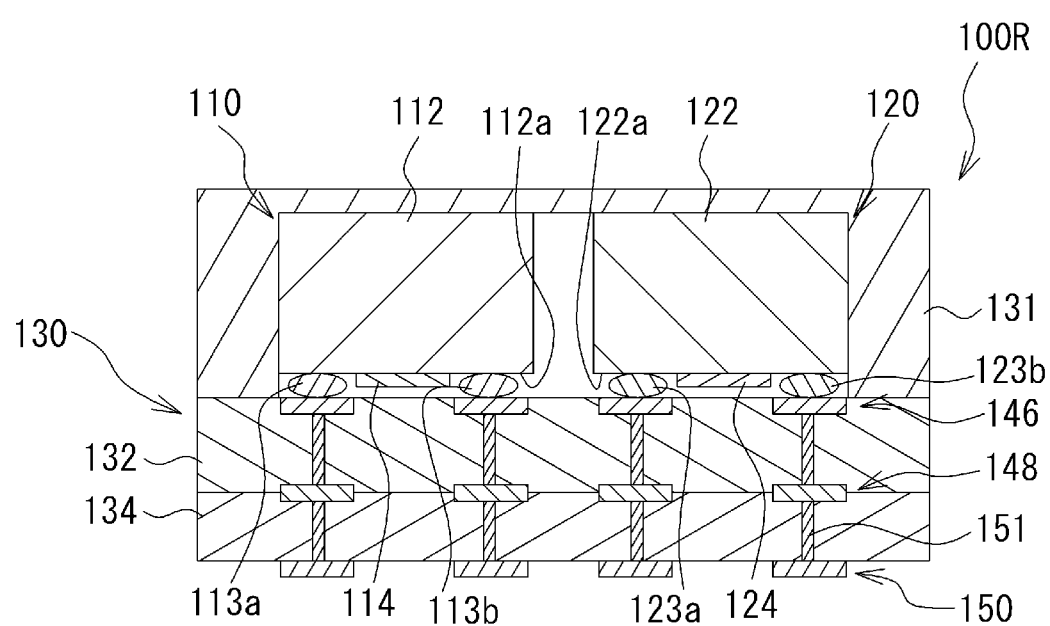
FIG. 2 is a cross-sectional view illustrating a demultiplexer according to a comparative example.

Next, a description will be given of an acoustic wave device 100R including a SAW filter, as a comparative example. FIG. 2 is a cross-sectional view illustrating the acoustic wave device 100R according to the comparative example.

As illustrated in FIG. 2, the acoustic wave device 100R includes chips 110 and 120. A filter 114, and terminals 113a and 113b electrically connected to the filter 114 are formed on a surface 112a of a piezoelectric substrate 112 in the chip 110. A filter 124, and terminals 123a and 123b electrically connected to the filter 124 are formed on a surface 122a of a piezoelectric substrate 122 in the chip 120. Each of the filters 114 and 124 is the SAW filter including an IDT (Interdigtal Transducer) and a reflector. The terminals 113a, 113b, 123a, and 123b are formed with a solder in which tin and silver (Sn—Ag) are principal ingredients, for example, and include bumps projected from the surfaces 112a and 122a. The chips 110 and 120 are flip-chip mounted on a substrate 130 so that the filters 114 and 124 are opposed to the substrate 130. The chips 110 and 120 are sealed with a sealer 131 which is formed with a resin, such as an epoxy resin.

The substrate 130 is a laminated substrate which laminates insulating layers 132 and 134 and the conductor layers 146, 148, and 150. Via wirings 151 that penetrate the insulating layers 132 and 134 are connected between the conductor layers. The filters 114 and 124 are connected to the conductor layers 146 via the terminals. The conductor layers 146 are connected to the conductor layers 150 via the conductor layers 148 and the via wirings 151, respectively. Each conductor layer 150 functions as a footpad which performs the input or the output of a signal.

When the acoustic wave device 100R is a demultiplexer, the filter 114 functions as the transmission filter F1 in FIG. 1A and the filter 124 functions as the reception filter F2. The conductor layers 150 include the transmission terminal Tx, the reception terminal Rx, the antenna terminal Ant and a ground terminal, not shown, in FIG. 1A. The acoustic wave device 100R can also be used as the dual filter. In this case, the filter 114 functions as the filter F3 in FIG. 1B and the filter 124 functions as the filter F4. The conductor layers 150 include the input terminals In1 and In2 and the output terminals Out1 and Out2.

In order to downsize the acoustic wave device 100R, it is effective to make the chips 110 and 120 approach each other. The filter 114 and the filter 124 approach each other, so that a signal which flows into the filter 114 leaks to the filter 124 easily and a signal which flows into the filter 124 leaks to the filter 114 easily As a result of leakage of the signal, a degree of suppression of the filters 114 and 124 deteriorates. Thus, the isolation decreases between the filters 114 and 124.

First Embodiment

Figure 3:
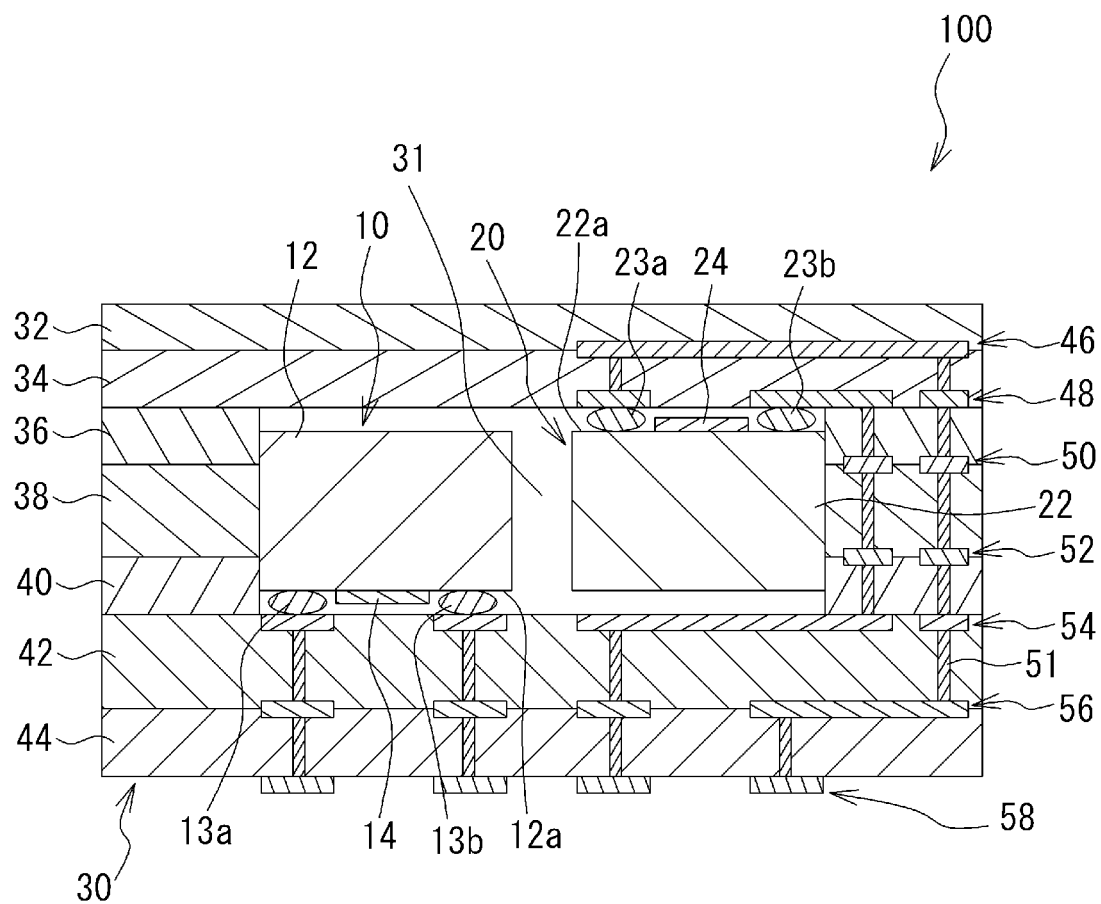
FIG. 3 is a cross-section view illustrating a demultiplexer according to a first embodiment.

A first embodiment is an example in which the surfaces of two chips on which the filters are formed are oppositely directed to each other. FIG. 3 is a cross-section view illustrating an acoustic wave device 100 according to a first embodiment.

A illustrated in FIG. 3, a substrate 30 (a third substrate) is a laminated substrate which laminates a plurality of insulating layers 32, 34, 36, 38, 40, 42 and 44 and a plurality of conductor layers 46, 48, 50, 52, 54, 56 and 58. The insulating layers are formed by a resin, such as an epoxy resin and a glass epoxy resin, or an insulator, such as a ceramic. The conductor layers are formed by a metal, such as copper (Cu) or aluminum (Al), or an alloy including these metals, for example. The chips 10 and 20 are embedded in the insulating layers 36, 38 and 40, and are arranged in a cavity 31 formed in the insulating layers 36, 38 and 40. Gas, such as argon (Ar), is sealed in the cavity 31.

The chip 10 (a first chip) includes a piezoelectric substrate 12 (a first substrate), terminals 13a and 13b (a first terminal) formed on a surface 12a (a first surface) of the piezoelectric substrate 12, and a filter 14 (a first filter). The filter 14 includes the SAW filter, for example, and is electrically connected to the terminals 13a and 13b. The terminals 13a and 13b are connected to the conductor layers 54 and 56, and the conductor layers 58 functioning as a footpad, through via wirings 51. The chip 20 (a second chip) includes a piezoelectric substrate 22 (a second substrate), terminals 23a and 23b (a second terminal) formed on a surface 22a (a second surface) of the piezoelectric substrate 22, and a filter 24 (a second filter). The filter 24 includes the SAW filter, for example, and is electrically connected to the terminals 23a and 23b. The terminal 23a is connected to one of the conductor layers 58 via the conductor layers 46, 48, 50, 52, 54 and 56 and the via wirings 51. The terminal 23b is connected to one of the conductor layers 58 via the conductor layers 48, 50, 52, 54 and 56 and the via wirings 51. The pass band of the filter 14 does not overlap with the pass band of the filter 24. Since the filters 14 and 24 are exposed in the cavity 31, excitation of an acoustic wave is not prevented.

The surface 12a is opposed to an insulating layer 42. The surface 22a is directed to an opposite direction against the surface 12a, and is opposed to an insulating layer 34. Therefore, in the first embodiment, a distance between the filter 14 and the filter 24 becomes large, compared with the comparative example. Accordingly, it is difficult for the signal which flows through the filter 14 to leak to the filter 24, and it is difficult for the signal which flows through the filter 24 to leak to the filter 14. As a result, even when the acoustic wave device 100 is downsized, high isolation is obtained between the filter 14 and the filter 24.

When the acoustic wave device 100 is a demultiplexer, the filter 14 functions as the transmission filter F1 in FIG. 1A and the filter 24 functions as the reception filter F2, for example. The conductor layers 58 include the transmission terminal Tx, the reception terminal Rx, the antenna terminal Ant (a common terminal) and the ground terminal in FIG. 1A. The terminals 13a and 13b are connected to the transmission terminal Tx and the antenna terminal Ant or the antenna terminal Ant and the transmission terminal Tx, respectively. The terminals 23a and 23b are connected to the reception terminal Rx and the antenna terminal Ant or the antenna terminal Ant and the reception terminal Rx, respectively. In this case, high isolation is obtained between the transmission filter F1 and the reception filter F2. The terminals 13a and 13b which input or output a signal from/to the outside of the chip 10 are provided on the surface 12a, and the terminals 23a and 23b which input or output a signal from/to the outside of the chip 20 are provided on the surface 22a. Since a distance between the terminals 13a and 13b and the terminals 23a and 23b becomes large, the isolation between the transmission terminal Tx and the reception terminal Rx in FIG. 1A becomes high. For example, a ladder type filter described later is used as the transmission filter F1, and a cascade connection type multimode filter (hereinafter referred to as "a multimode filter") described later is used as the reception filter F2, for example. Moreover, the filter 14 may be used as the reception filter F2, and the filter 24 may be used as the transmission filter F1.

The acoustic wave device 100 can also be used as the dual filter. In this case, the filter 14 functions as the filter F3 in FIG. 1B and the filter 24 functions as the filter F4, for example. The conductor layers 58 include the input terminals In1 and In2 and the output terminals Out1 and Out2. The terminals 13a and 13b are connected to the input terminal In1 and the output terminal Out1 or the output terminal Out1 and the input terminal In1, respectively. The terminals 23a and 23b are connected to the input terminal In2 and the output terminal Out2 or the output terminal Out2 and the input terminal In2, respectively. In this case, high isolation is obtained between the filter F3 and the filter F4. Moreover, since the distance between the terminals 13a and 13b and the terminals 23a and 23b becomes large, the isolation between the input terminal In1 and the output terminal Out1 in FIG. 1B and the input terminal In2 and the output terminal Out2 become high.

The pass band of the filter 14 does not need to overlap with the pass band of the filter 24, or a part of the pass band of the filter 14 may overlap with a part of the pass band of the filter 24. Moreover, the pass band of the filter 14 may differ from or be the same as the pass band of the filter 24. Although the chips 10 and 20 may be embedded in different insulating layers, respectively, there is a possibility that the substrate 30 becomes thick. As illustrated in FIG. 3, the substrate 30 can be thinned by embedding the chips 10 and 20 into the same insulating layers 36, 38 and 40. Moreover, the embedding process is also simplified. Although the side surfaces of the chips 10 and 20 come in contact with the insulating layers 36, 38 and 40, the side surfaces of the chips 10 and 20 may be separated from the insulating layers 36, 38 and 40. Moreover, the cavity 31 need not be formed in the insulating layers 36, 38 and 40, and the chips 10 and 20 may also be embedded into the insulating layers 36, 38 and 40. In this case, the chips 10 and 20 are wafer level packages (WLP) mentioned later, for example. Moreover, two cavities may be formed, and the chip 10 may be located in the cavity different from a cavity in which the chip 20 is located. Here, the number of insulating layers and conductor layers included in the substrate 30 can be changed.

Figure 4A:
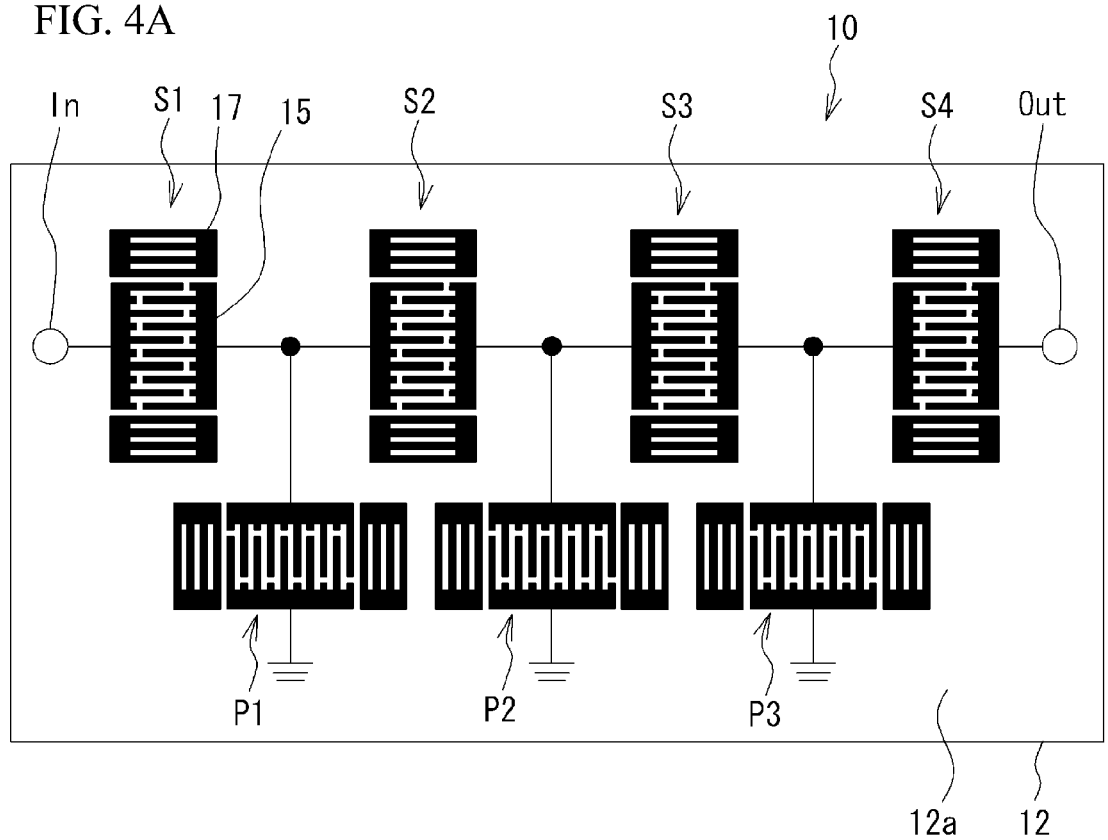
FIG. 4A is a plan view illustrating a ladder type filter.

Next, a description will be given of an example of the SAW filter. FIG. 4A is a plan view illustrating a ladder type filter, and is an example in which the filter 14 is the ladder type filter.

As illustrated in FIG. 4A, serial resonators S1 to S4 and parallel resonators P1 to P3 are provided on the surface 12a of the piezoelectric substrate 12. The serial resonators S1 to S4 are connected in series between an input terminal In and an output terminal Out. The parallel resonator P1 is connected between the serial resonators S1 and S2, the parallel resonator P2 is connected between the serial resonators S2 and S3, and the parallel resonator P3 is connected between the serial resonators S3 and S4. The parallel resonators P1 to P3 are grounded. Each of the serial resonators S1 to S4 and the parallel resonators P1 to P3 is the SAW filter including an IDT 15 and reflectors 17. The terminals 13a and 13b of FIG. 3 function as the input terminal In and the output terminal Out.

Figure 4B:
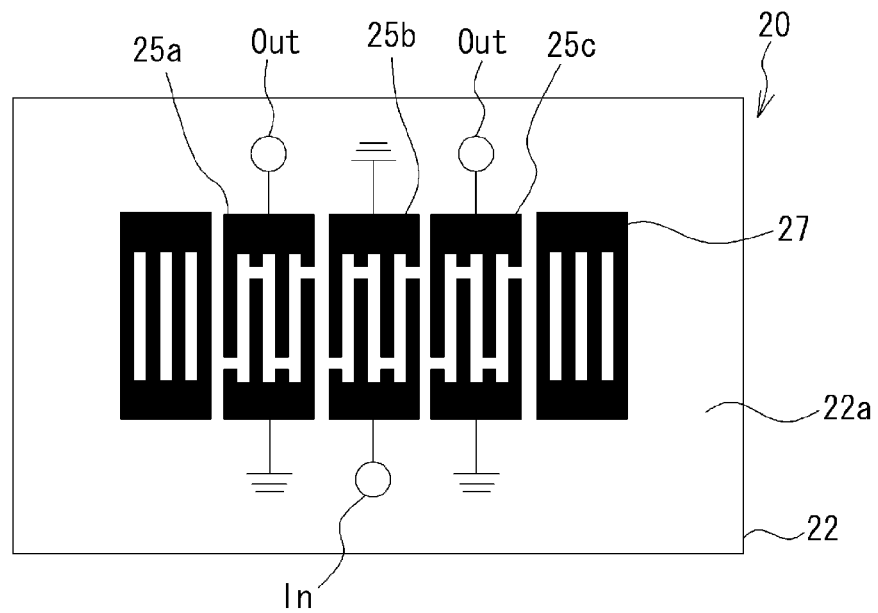
FIG. 4B is a is a plan view illustrating a multiplex mode filter.

FIG. 4B is a plan view illustrating a multiplex mode filter, and is an example in which the filter 24 is the multiplex mode filter. As illustrated in FIG. 4B, on the surface 22a of the piezoelectric substrate 22, IDTs 25a, 25b and 25c are arranged along a propagation direction of the acoustic wave from the left to the right, and reflectors 27 are arranged so as to sandwich the IDTs 25a to 25c. One comb-type electrode of the IDT 25a and one comb-type electrode of the IDT 25c are connected to output terminals Out, respectively. One comb-type electrode of the IDT 25b is connected to an input terminal In. The other comb-type electrodes of the IDTs 25a to 25c are grounded. The two output terminals Out is balance terminals, and the input terminal In is an unbalanced terminal. Here, the output terminals Out may be unbalanced terminals. The terminals 23a and 23b of FIG. 3 include the output terminal Out and the input terminal In.

Each of the piezoelectric substrates 12 and 22 includes a piezoelectric substance, such as lithium tantalate (LiTaO$_3$) or lithium niobate (LiNbO$_3$), for example. Each of the IDT and the reflector is formed of a metal, such as aluminum, for example. Here, the number of electrode fingers can be changed. Moreover, the chips 10 and 20 may include at least one of the ladder type filter and the multiplex mode filter, and may an acoustic wave filter other than these filers.

Second Embodiment

Figure 5A:
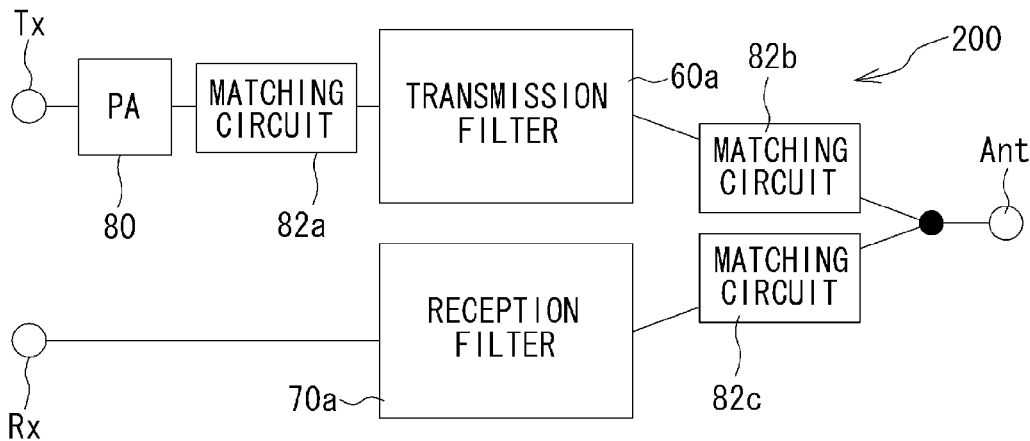
FIG. 5A is a block diagram illustrating a module according to a second embodiment.
Figure 5B:
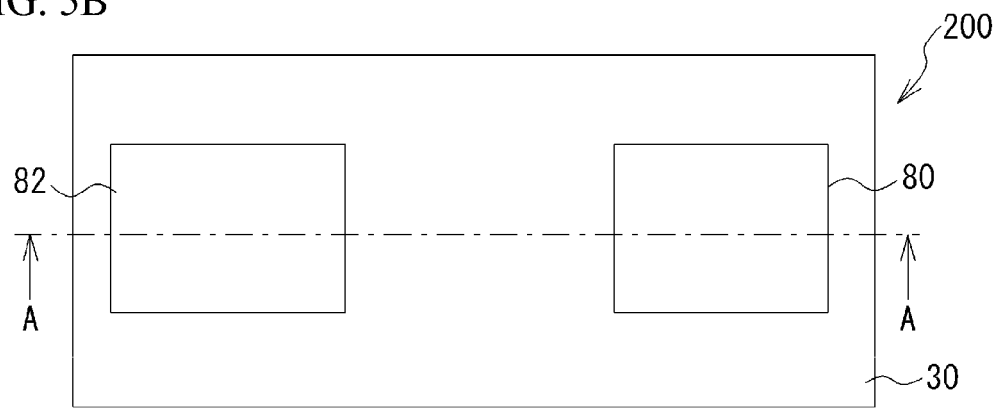
FIG. 5B is a plan view illustrating the module.
Figure 5C:
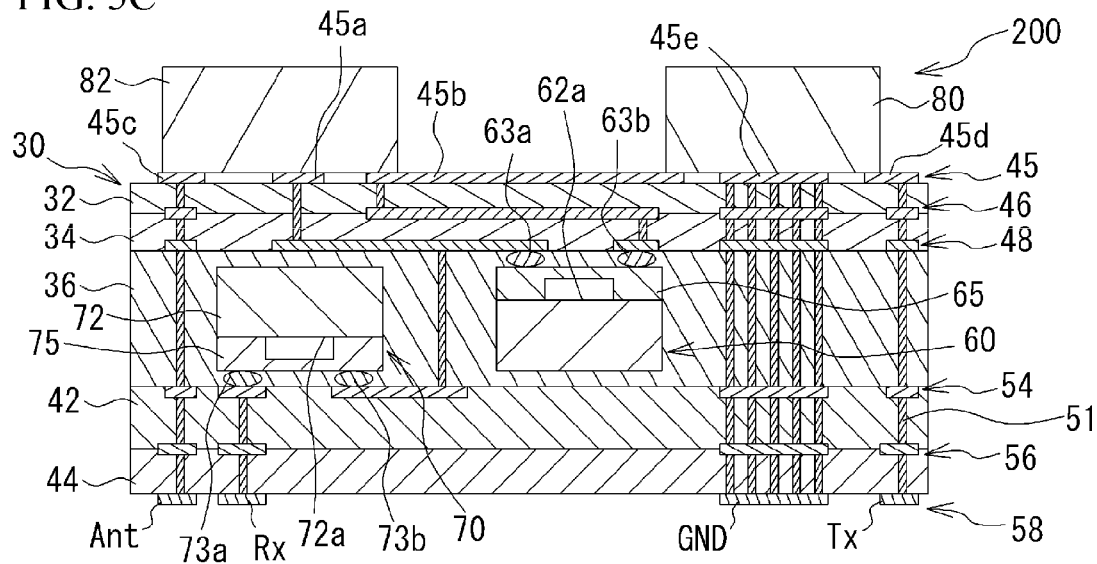
FIG. 5C is a cross-sectional view taken along a line A-A in FIG. 5B.

A second embodiment is an example of a module including a demultiplexer. FIG. 5A is a block diagram illustrating a module 200 according to a second embodiment. FIG. 5B is a plan view illustrating the module 200. FIG. 5C is a cross-sectional view taken along a line A-A in FIG. 5B. In FIG. 5B, the illustration of the conductor layers 45 are omitted. The explanation about composition mentioned already in FIGS. 1A and 2 is omitted.

As illustrated in FIG. 5A, a transmission filter 60a and a reception filter 70a of the module 200 form a demultiplexer. A power amplifier (Power Amplifier: PA) 80 is electrically connected between a transmission terminal Tx and the transmission filter 60a, and a matching circuit 82a is electrically connected between the PA 80 and the transmission filter 60a. The matching circuit 82b is electrically connected between the transmission filter 60a and an antenna terminal Ant, and the matching circuit 82c is electrically connected between the reception filter 70a and the antenna terminal Ant. The matching circuit 82a performs impedance matching between the transmission filter 60a and the PA 80. The matching circuit 82b performs impedance matching between an antenna (not shown) connected to the antenna terminal Ant and the transmission filter 60a. The matching circuit 82c performs impedance matching between the antenna and the reception filter 70a. The pass band of the transmission filter 60a may differ from or be the same as the pass band of the reception filter 70a. The transmission filter 60a is the ladder type filter illustrated in FIG. 4A, for example. The reception filter 70a is the multiplex mode filter illustrated in FIG. 4B, for example.

As illustrated in FIG. 5B, the PA 80 and a chip component 82 are mounted on the substrate 30 (the third substrate) and are connected to the conductor layers 45. As illustrated in FIG. 5C, a chip 60 and a chip 70 are embedded in the insulating layer 36 of the substrate 30.

The chip 60 is a WLP including a piezoelectric substrate 62, a transmission filter (not shown), terminals 63a and 63b, and a sealer 65. The transmission filter and terminals 63a and 63b are formed on the surface 62a. The transmission filter is sealed by the sealer 65 made of a resin, and is exposed in a cavity between the surface 62a and the sealer 65. The terminals 63a and 63b are electrically connected to the transmission filter, and penetrate the sealer 65. The chip 70 is a WLP including a piezoelectric substrate 72, a reception filter (not shown), terminals 73a and 73b, and a sealer 75. The transmission filter included in the chip 60 functions as the transmission filter 60a of FIG. 5A, and the reception filter included in the chip 70 functions as the reception filter 70a.

Side surfaces and an upper surface of the chip 60, side surfaces and an upper surface of the chip 70 and the sealers 65 and 75 come in contact with the insulating layer 36. The conductor layers 45 include wirings 45a to 45e. The conductor layers 58 includes the antenna terminal Ant, the transmission terminal Tx, the reception terminal Rx, and the ground terminal. The chip component 82 includes at least one of an inductor and an capacitor, and functions as the matching circuits 82a, 82b and 82c in FIG. 5A.

The terminal 63a of the chip 60 is electrically connected to the chip component 82 via the conductor layer 48, the via wiring 51 and the wiring 45a. The terminal 73b of the chip 70 is electrically connected to the chip component 82 in common with the terminal 63a, via the conductor layers 54 and 48, the via wiring 51 and the wiring 45a. The terminal 63b of the chip 60 is electrically connected to the chip component 82 via the conductor layers 48 and 46, the via wirings 51 and the wiring 45b. The terminal 73a of the chip 70 is electrically connected to the reception terminal Rx via the conductor layers 54 and 56 and the via wirings 51. The chip component 82 is connected to the antenna terminal Ant via the wiring 45c, the conductor layers 46, 48, 54 and 56 and the via wirings 51, and is connected to the PA 80 via the wiring 45b. The PA 80 is connected to the transmission terminal Tx via the wiring 45d, the conductor layers 46, 48, 54 and 56 and the via wirings 51. The PA 80 is an active element and generates heat. The heat generated in the PA 80 is emitted to the outside of the module 200 through the ground terminal GND which is connected to the PA 80 through the wiring 45e, conductor layers 46, 48, 54 and 56 and the via wirings 51.

The surface 62a is opposed to the insulating layer 34. The surface 72a is directed to an opposite direction against the surface 62a, and is opposed to the insulating layer 42. Therefore, according to the second embodiment, also in the module, high isolation can be obtained as with the first embodiment.

Third Embodiment

Figure 6A:
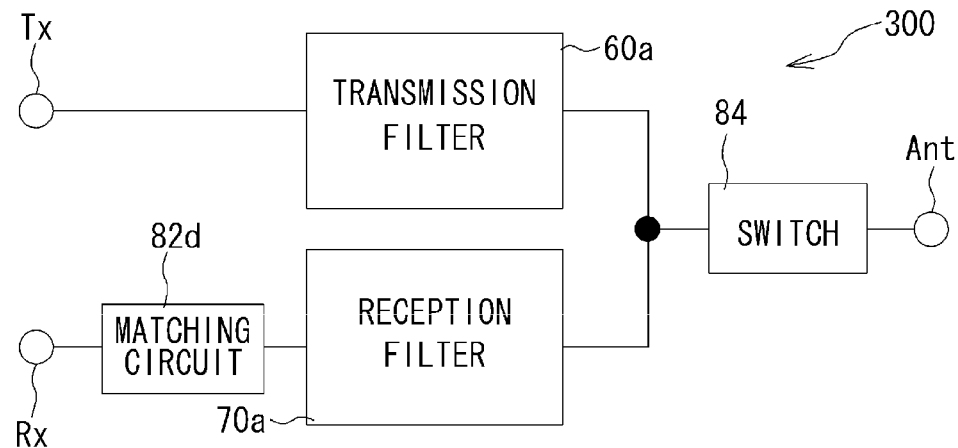
FIG. 6A is a block diagram illustrating a module according to a third embodiment.
Figure 6B:
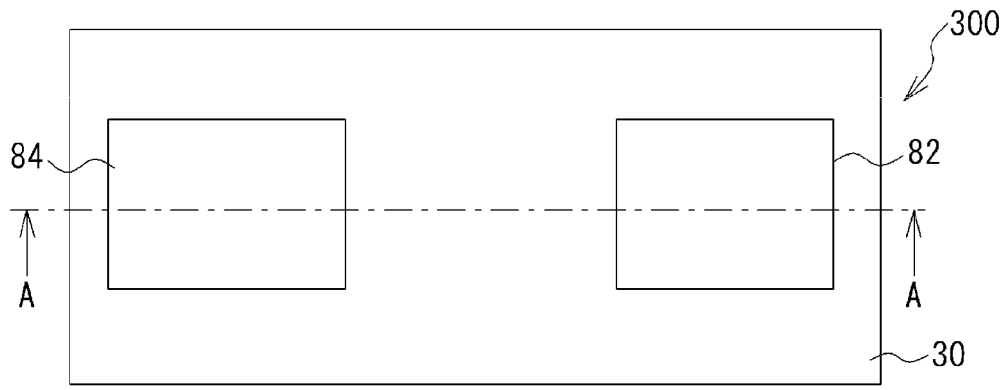
FIG. 6B is a plan view illustrating the module.
Figure 6C:
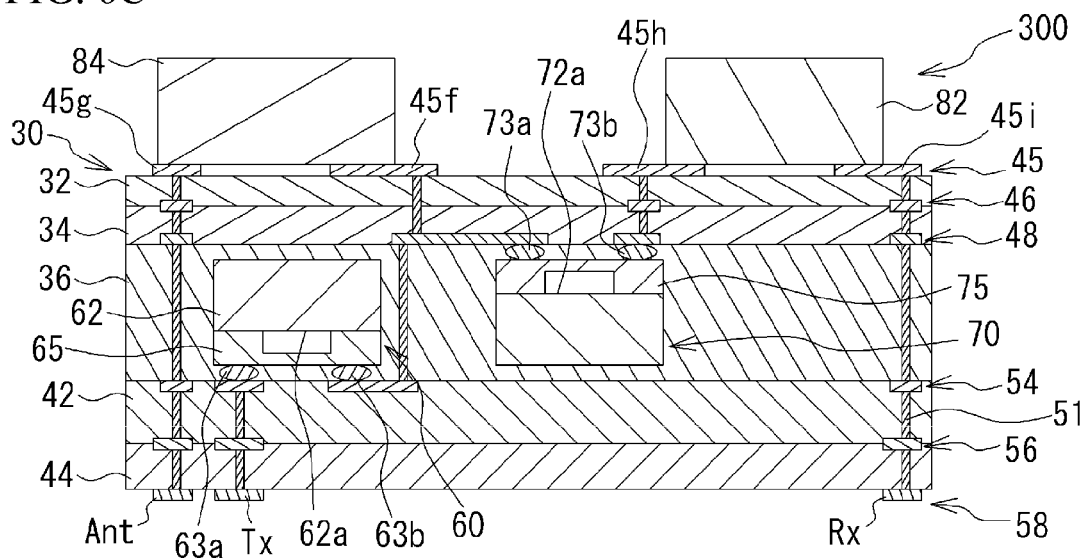
FIG. 6C is a cross-sectional view taken along a line A-A in FIG. 6B.

A third embodiment is an example of a module other than the module of the second embodiment. FIG. 6A is a block diagram illustrating a module 300 according to the third embodiment. FIG. 6B is a plan view illustrating the module 300. FIG. 6C is a cross-sectional view taken along a line A-A in FIG. 6B. The explanation about composition mentioned already in FIGS. 1B, 2 and 6C is omitted.

As illustrated in FIG. 6A, in the module 300, a matching circuit 82d is connected between the reception terminal Rx and the reception filter 70a. The matching circuit 82d performs impedance matching between a component (not shown), such as an IC to be connected to the reception terminal Rx, and the reception filter 70a. A switch 84 is connected between the antenna terminal Ant and the transmission filter 60a and the reception filter 70a. The switch 84 selects one from among a demultiplexer including the transmission filter 60a and the reception filter 70a, and another demultiplexer (not shown), and connects the selected demultiplexer to the antenna terminal Ant. When the pass band of the transmission filter 60a is the same as that of the reception filter 70a, for example, the switch 84 may select one from among the transmission filter 60a and the reception filter 70a, and connect the selected filter to the antenna terminal Ant.

As illustrated in FIG. 6B, the chip component 82 and the switch 84 are mounted on the upper surface of the substrate 30. The chip component 82 functions as the matching circuit 82d of FIG. 6A. As illustrated in FIG. 6C, the conductor layers 45 include wirings 45f to 45i. The terminal 63a of the chip 60 is connected to the transmission terminal Tx via the conductor layers 54 and 56 and the via wirings 51. The terminal 63b of the chip 60 is connected to the switch 84 via the conductor layers 54 and 48, the via wirings 51 and the wiring 45f. The terminal 73a of the chip 70 is connected to the switch 84 in common with the terminal 63b, via the conductor layer 48, the via wiring 51 and the wiring 45f. The switch 84 is connected to the antenna terminal Ant via the wiring 45g, the conductor layers 46, 48, 54 and 56 and the via wirings 51. The terminal 73b of the chip 70 is connected to the chip component 82 via the conductor layers 48 and 46, the via wirings 51 and the wiring 45h. The chip component 82 is connected to the reception terminal Rx via the wiring 45i, the conductor layers 46, 48, 54 and 56 and the via wirings 51. According to the third embodiment, since the surface 72a is directed to an opposite direction against the surface 62a as with the first embodiment, high isolation can be obtained.

The second and the third embodiments are examples in which the cavity is not formed in the insulating layer 36, and the chip 60 and the chip 70 are embedded in the insulating layer 36. In the second and the third embodiments, a cavity like the cavity 31 of FIG. 3 may be formed in the insulating layer 36 and the chip 60 and the chip 70 may be embedded in the cavity. Moreover, the second and the third embodiments may be applied to the module including a dual filter. In this case, the conductor layers 58 include the input terminals In1 and In2 and the output terminals Out1 and Out2 (see FIG. 1B). There are ICs or the like other than the PA 80, the chip component 82 and the switch 84, as components mounted on the upper surface of the substrate 30, and any component may be used from among these. Moreover, a filter may be embedded in a single layer substrate other than the multilayer substrate, for example. The arrangement of the wirings (conductor layers and the via wirings 51) which connect the filters to the components can also be changed in accordance with the positions of the components and the filters.

Fourth Embodiment

Figure 7:
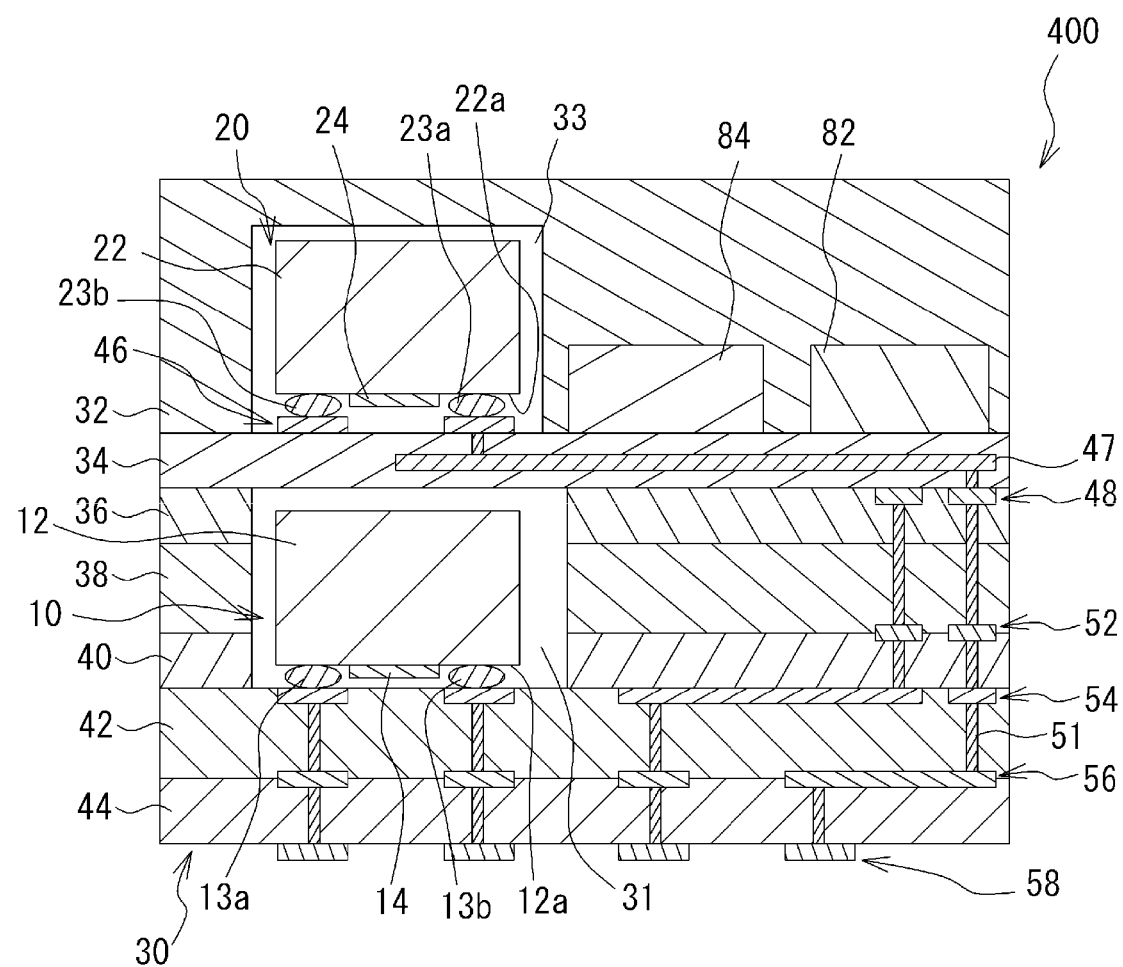
FIG. 7 is a cross-sectional view illustrating a module according to a fourth embodiment.

A fourth embodiment is an example in which the surface 12a and the surface 22a are located in different planes. FIG. 7 is a cross-sectional view illustrating a module 400 according to a fourth embodiment.

As illustrated in FIG. 7, the chip 10 is embedded in the insulating layers 36, 38 and 40. The chip 20 is embedded in the insulating layer 32, and is located in the cavity 33 and above the chip 10. The surface 12a and the surface 22a are directed to a same direction. The surface 12a is located in the cavity 31, and is opposed to the insulating layer 42. The surface 22a is located in the cavity 33, and is opposed to the insulating layer 34. That is, an upper surface (a first mounting surface) of the insulating layer 42 on which the chip 10 is mounted, and an upper surface (a second mounting surface) of the insulating layer 34 on which the chip 20 is mounted are located in different planes. Therefore, the distance between the filter 14 and the filter 24 becomes large, and hence high isolation can be obtained.

The terminal 23a is connected to the conductor layer 58 via the conductor layer 46, a conductor layer 47 in the insulating layer 34, the conductor layers 48, 52, 54 and 56 and the via wirings 51. The terminal 23b is connected to the conductor layer 58 via a conductor layer, not shown, provided in the insulating layer 34, the conductor layers 46, 48, 52, 54 and 56 and the via wirings 51, for example. Although the chip component 82 and the switch 84 are embedded in the insulating layer 32, the chip component 82 and the switch 84 need not be provided, for example. Although the chip 10 and the chip 20 overlap with each other in a thickness direction of the substrate 30, they need not overlap with each other. Moreover, the chip 10 may be provided above the chip 20. In the fourth embodiment, the cavities 31 and 33 need not be formed in the insulating layers of the substrate 30, and the chips 10 and 20 may be embedded into the insulating layers as with the second and the third embodiments. As described in the first to the fourth embodiments, the surface 22a is located in the plane different from the surface 12a, and hence high isolation can be obtained.

The transmission filter may include the multiplex mode filter, and the reception filter may include the ladder type filter. Moreover, the filter may also include the SAW filter other than these filters. Although an example of the filter is the SAW filter in the first to the fourth embodiments, an acoustic boundary wave filter and another acoustic wave filter including the IDT such as a love wave resonator may be used, for example. Moreover, an acoustic wave filter which includes a piezoelectric thin film resonator other than the acoustic wave filter including the IDT may be applied. A FBAR (Film Bulk Acoustic Resonator) is explained as an example of the piezoelectric thin film resonator.

Figure 8:
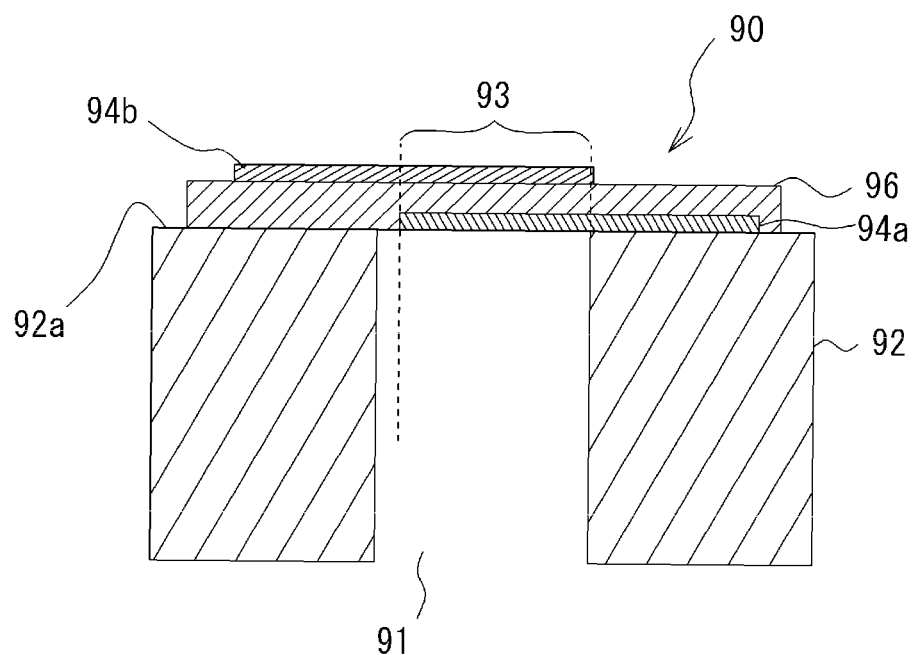
FIG. 8 is a cross-sectional view illustrating a FBAR.

FIG. 8 is a cross-sectional view illustrating a FBAR 90. A cavity 91 is formed in a substrate 92. The lower electrode 94a is formed on the surface 92a of the substrate 92 so as to overlap with the cavity 91. A piezoelectric thin film 96 is formed on the lower electrode 94a, and an upper electrode 94b is formed on the piezoelectric thin film 96. A resonance domain 93 with which the lower electrode 94a, the upper electrode 94b and the piezoelectric thin film 96 overlap is formed on the cavity 91. A laminated body of the lower electrode 94a, the upper electrode 94b and the piezoelectric thin film 96 functions as a resonator. The acoustic wave filter which uses the FBAR 90 may be applied to the first to the third embodiments. For example, in the first embodiment, the surface 92a in the chip 20 needs to be directed to an opposite direction against the surface 92a in the chip 10. In the fourth embodiment, the surface 92a in the chip 10 needs to be opposed to the insulating layer 42, and the surface 92a in the chip 20 needs to be opposed to the insulating layer 34, for example. Moreover, at least one of the filters 14 and 24 may be the acoustic wave filter including the IDT or the acoustic wave filter including the FBAR.

The substrate 92 is formed of an insulator, such as glass, silicon (Si) or sapphire. The piezoelectric thin film 96 includes a piezoelectric substance, such as aluminium nitride (AlN), for example. The lower electrode 94a and the upper electrode 94b are formed of a metal, such as ruthenium (Ru), for example. Although the lower electrode 94a is exposed in the cavity 91, the lower electrode 94a does not need to be exposed in the cavity 91. The cavity 91 may penetrate the substrate 92 or does not need to penetrate it. The cavity 91 is not formed in the substrate 92, and a portion on which the resonance domain 93 of the lower electrode 94a is formed may be upheaved from the surface 92a of the substrate 92. In this case, the surface 92a is flat and a gap occurs between the surface 92a and the lower electrode 94a. Except for the FBAR, another piezoelectric thin film resonator, such as a SMR (Solid Mounted Resonator) in which an acoustic reflection film is formed on the surface 92a and the lower electrode 94a is provided on the acoustic reflection film, may be used.

Although the embodiments of the present invention have been described in detail, it should be understood that the present invention is not limited to these specific embodiments, and the various change, substitutions, and alterations could be made hereto without departing from the spirit and scope of the invention.

What is claimed is:

1. An acoustic wave device comprising:
   a first chip that includes a first substrate, and a first filter formed on a first surface of the first substrate;
   a second chip that includes a second substrate, and a second filter formed on a second surface of the second substrate, the second surface being located in a plane different from the first surface;
   a third substrate that includes a plurality of laminated insulating layers including a first insulating layer, a second insulating layer, a third insulating layer and a fourth insulating layer,
   wherein
   the first surface and the second surface are directed to a same direction,
   the first chip is mounted on the first insulating layer and is embedded in the second insulating layer;
   the third insulating layer is located on the second insulating layer and overlaps with the first chip and the second chip in a planar view; and
   the second chip is mounted on the third insulating layer, overlaps with the first chip in the planar view and is embedded in the fourth insulating layer.

2. The acoustic wave device according to claim 1, wherein a pass band of the first filter differs from a pass band of the second filter.

3. The acoustic wave device according to claim 1, wherein the first chip includes a first terminal that is formed on the first surface, connected to the first filter, and inputs or outputs a signal from/to the outside of the first chip, and the second chip includes a second terminal that is formed on the second surface, connected to the second filter, and inputs or outputs a signal from/to the outside of the second chip.

4. The acoustic wave device according to claim 1, comprising:
   a component provided on the third substrate; and
   a wiring that is provided on the third substrate, and connects the component to the first chip and the second chip.

5. The acoustic wave device according to claim 1, wherein the first filter is a transmission filter connected between a common terminal and a transmission terminal, and the second filter is a reception filter connected between the common terminal and a reception terminal.

6. The acoustic wave device according to claim 1, wherein the first filter and the second filter are unconnected to each other.

7. The acoustic wave device according to claim 1, wherein the first substrate and the second substrate are piezoelectric substrates, and at least one of the first filter and the second filter includes an IDT (Interdigtal Transducer).

8. The acoustic wave device according to claim 1, wherein at least one of the first filter and the second filter includes a piezoelectric thin film resonator.

9. An acoustic wave device comprising:
   a first chip that includes a first substrate, and a first filter formed on a first surface of the first substrate;
   a second chip that includes a second substrate, and a second filter formed on a second surface of the second substrate, the second surface being located in a plane different from the first surface; and
   a third substrate that includes a plurality of laminated insulating layers,
   wherein:
   the second surface is directed to a direction opposite to a direction in which the first surface is directed;
   the first chip and the second chip are embedded in a same insulating layer out of the plurality of laminated insulating layers;
   a pass band of the first filter differs from a pass band of the second filter;
   the first chip includes a first terminal that is formed on the first surface, connected to the first filter, and inputs a signal from the outside of the first chip;
   the second chip includes a second terminal that is formed on the second surface, connected to the second filter, and outputs a signal to the outside of the second chip;
   the first filter is a transmission filter connected between a common terminal and a transmission terminal formed on a bottom surface of the third substrate;
   the second filter is a reception filter connected between the common terminal and a reception terminal formed on a bottom surface of the third substrate;
   the transmission terminal and the first terminal are connected by a first wire that does not run between the first chip and the second chip; and
   the reception terminal and the second terminal are connected by a second wire that does not run between the first chip and the second chip.

10. An acoustic wave device comprising:
a first chip that includes a first substrate, and a first filter formed on a first surface of the first substrate;
a second chip that includes a second substrate, and a second filter formed on a second surface of the second substrate, the second surface being located in a plane different from the first surface; and
a third substrate that includes a plurality of laminated insulating layers,
wherein:
the second surface is directed to a direction opposite to a direction in which the first surface is directed;
the first chip and the second chip are embedded in a same insulating layer out of the plurality of laminated insulating layers;
a pass band of the first filter differs from a pass band of the second filter;
the first chip includes a first terminal that is formed on the first surface, connected to the first filter, and inputs a signal from the outside of the first chip and a second terminal that is formed on the first surface, connected to the first filter, and outputs a signal to the outside of the first chip;
the second chip includes a third terminal that is formed on the second surface, connected to the second filter, and inputs a signal from the outside of the second chip and a fourth terminal that is formed on the second surface, connected to the second filter, and outputs a signal to the outside of the first chip;
the first filter is connected between a first input terminal and a first output terminal, the first input terminal and the first output terminal formed on a bottom surface of the third substrate;
the second filter is connected between a second input terminal and a second output terminal, the second input terminal and the second output terminal formed on the bottom surface of the third substrate;
the first filter and the second filter are unconnected to each other in the third substrate;
the first input terminal and the first terminal are connected by a first wire that does not run between the first chip and the second chip;
the first output terminal and the second terminal are connected by a second wire that does not run between the first chip and the second chip;
the second input terminal and the third terminal are connected by a third wire that does not run between the first chip and the second chip; and
the second output terminal and the fourth terminal are connected by a fourth wire that does not run between the first chip and the second chip.

* * * * *